(12) United States Patent
Xi et al.

(10) Patent No.: US 10,120,342 B2
(45) Date of Patent: Nov. 6, 2018

(54) METHOD AND DEVICE FOR ACQUIRING TIME POINT WHERE GLIMMERING PULSE PASSES OVER THRESHOLD

(71) Applicant: RAYCAN TECHNOLOGY CO., LTD. (SU ZHOU), Suzhou New District, Suzhou, Jiangsu (CN)

(72) Inventors: Daoming Xi, Jiangsu (CN); Wei Liu, Jiangsu (CN); Qingguo Xie, Jiangsu (CN)

(73) Assignee: Raycan Technology Co., Ltd., Suzhou, Jiangsu (CN)

( * ) Notice: Subject to any disclaimer, the term of this patent is extended or adjusted under 35 U.S.C. 154(b) by 197 days.

(21) Appl. No.: 15/035,996

(22) PCT Filed: Dec. 25, 2013

(86) PCT No.: PCT/CN2013/090392
§ 371 (c)(1),
(2) Date: May 11, 2016

(87) PCT Pub. No.: WO2015/070504
PCT Pub. Date: May 21, 2015

(65) Prior Publication Data
US 2016/0274547 A1 Sep. 22, 2016

(30) Foreign Application Priority Data

Nov. 14, 2013 (CN) .......................... 2013 1 0572921

(51) Int. Cl.
*G01T 1/20* (2006.01)
*H03K 5/08* (2006.01)
*G04F 13/02* (2006.01)

(52) U.S. Cl.
CPC ................ *G04F 13/02* (2013.01); *G01T 1/20* (2013.01); *H03K 5/08* (2013.01)

(58) Field of Classification Search
CPC .............. G01T 1/20; H03K 5/08; G04F 13/02
See application file for complete search history.

(56) References Cited

U.S. PATENT DOCUMENTS 5,148,178 A * 9/1992 Holzer .................... G01F 23/28
342/118
7,617,270 B2 11/2009 Nikitin
(Continued)

FOREIGN PATENT DOCUMENTS

| CN | 1303174 A | 7/2001 |
|---|---|---|
| CN | 1790035 A | 6/2006 |

(Continued)

OTHER PUBLICATIONS

Search Report dated Jul. 4, 2017 in corresponding EP Application No. 13897366.4.

(Continued)

*Primary Examiner* — Bryan Bui
(74) *Attorney, Agent, or Firm* — Knobbe, Martens, Olson & Bear, LLP

(57) ABSTRACT

A method is for acquiring a time point where a glimmering pulse passes over a threshold. The method includes: converting a relationship between a pulse and a threshold into high and low level signals; segmenting output level signals. For a phase where a pulse signal passes over and is higher than a preset threshold and a phase where a pulse signal passes over and is lower than the preset threshold, the two phases respectively include several time points generated by several jumps, and the time point where a pulse passes over a threshold is recorded as any one jump time point or a weighted value of any two or more jump time points. By selecting one jump time point or weighting any two or more jump time points, a more accurate time point where a pulse actually passes over a threshold can be obtained.

12 Claims, 2 Drawing Sheets

(56) References Cited

U.S. PATENT DOCUMENTS

| | | |
|---|---|---|
| 9,772,408 B2 * | 9/2017 | Xie .................... G01T 1/17 |
| 2005/0247879 A1 | 11/2005 | Xie et al. |
| 2006/0176082 A1 | 8/2006 | Johnstone et al. |
| 2009/0002033 A1 | 1/2009 | Nakatani et al. |
| 2010/0025589 A1 | 2/2010 | Olcott et al. |
| 2010/0045377 A1 | 2/2010 | Witchard |
| 2010/0078569 A1 | 4/2010 | Jarron et al. |
| 2014/0052414 A1 | 2/2014 | Xie et al. |
| 2015/0200680 A1 | 7/2015 | Xie et al. |

FOREIGN PATENT DOCUMENTS

| | | |
|---|---|---|
| CN | 101523723 A | 9/2009 |
| CN | 101617473 A | 12/2009 |
| CN | 102262238 A | 11/2011 |
| CN | 202177701 U | 3/2012 |
| CN | 102843139 A | 12/2012 |
| CN | 202801645 U | 3/2013 |
| EP | 1672794 A2 | 6/2006 |
| JP | 2005-308737 A | 11/2005 |
| JP | 2008-045900 A | 2/2008 |
| JP | 2009-010827 A | 1/2009 |
| JP | 2009-544973 A | 12/2009 |
| WO | 2008/022025 A2 | 2/2008 |
| WO | 2008/079445 A2 | 7/2008 |

OTHER PUBLICATIONS

Office Action dated Apr. 24, 2017 in corresponding JP Application No. 2016-529452.

Office Action dated Nov. 2, 2017 in corresponding CN Application No. 201310572921.0.

Wang et al., Initial Implementation of All-Digital PET DAQ System, Nuclear Science Symposium Conference Record (NSS/MIC), 2010 IEEE, Oct. 30, 2010, pp. 2500-2503.

Xie et al, Initial Implementation of LYSO-PSPMT Block Detector with an All Digital DAQ System, Nuclear Science Symposium Conference Record (NSS/MIC), 2010 IEEE, Oct. 30, 2010, pp. 1759-1762.

* cited by examiner

METHOD AND DEVICE FOR ACQUIRING TIME POINT WHERE GLIMMERING PULSE PASSES OVER THRESHOLD

CROSS REFERENCE OF RELATED APPLICATION

This application is the U.S. National Phase under 35. U.S.C. § 371 of International Application PCT/CN2013/090392, filed Dec. 25, 2013, which claims the priority to Chinese Patent Application No. 201310572921.0, titled "METHOD AND DEVICE FOR ACQUIRING TIME POINT WHEN SCINTILLATION PULSE PASSES THRESHOLD", filed on Nov. 14, 2013 with State Intellectual Property Office of PRC, which is hereby incorporated by reference in its entirety.

FIELD

The disclosure relates to the technical field of digital signal processing, photoelectric signal processing, and radiation detection and measurement, and in particular to a method and a device for acquiring a time point when a scintillation pulse passes over a threshold, which are applicable to energetic particle detection and medical imaging devices.

BACKGROUND

In the technical field of positron emission tomography (hereinafter abbreviated to PET) and radiation detection and measurement, a scintillator detector is commonly used for energetic particle detection. The general operating principle of the scintillator detector is that: energetic particles are converted into visible light by a scintillation crystal, and then the visible light is converted into an electrical pulse signal by a photodetector. A typical electrical pulse signal is shown in FIG. 1. The electrical pulse signal may be further processed to acquire information of the energetic particles, such as energy and time information.

The acquiring time information where the electrical pulse passes over a threshold is widely applied in the field. In conventional methods, the time information of the energetic particle is acquired by detecting a time point when the electrical pulse passes over a preset threshold. Meanwhile, a multi-threshold sampling device in the conventional technology is used to implement electrical pulse digitization by acquiring the time information where the electrical pulse passes over multiple thresholds, so as to solve the technical issue of insufficient sampling rate and high power consumption of the traditional analog-to-digital converter (hereinafter abbreviated to ADC) while digitizing such electrical pulses.

Currently, the detection of the time points when the electrical pulse passes over the threshold is implemented by combining a comparator with a time-to-digit converter. The comparator is configured to compare the electrical pulse with the threshold and output high-level signals or low-level signals based on the comparison result. Ideally, the time point when the electrical pulse passes over the threshold corresponds to a transition between a high level and a low level in the outputted signals of the comparator, and the time point for the transition may be captured with the time-to-digit converter. In practice, multiple transitions may occur in the outputted signals of the comparator during a time period where the electrical pulse passes over the threshold due to noises in the electrical pulse. As shown in FIG. 2, in a falling edge of a scintillation pulse, during a time period where the scintillation pulse passes over the threshold, multiple transitions occur in the output signals of the comparator during a time period from B to C due to the influence of the noises, where B is a time point for a first transition and C is a time point for a last transition. Apparently, an accurate time point when the scintillation pulse passes over the threshold should be between B and C. Conventionally, the time point for the first transition, i.e., the time point B shown in FIG. 2, is captured as the time point when the scintillation pulse passes over the threshold. The method may be implemented with a simpler circuit, but the acquired time point is not sufficiently accurate.

Therefore, in light of the above technical issue, there is a need to provide a new method for acquiring a time point when a scintillation pulse passes over a threshold, so as to solve the issue that the time points can not be acquired accurately due to noises, and thus provide more accurate time points when the scintillation pulse passes over the threshold.

SUMMARY

In view of the above, it is an object of the present disclosure to provide a method and a device for acquiring a time point when a scintillation pulse passes over a threshold, so as to solve the issue that the time point can not be acquired accurately due to noises.

To achieve the above object, the following technical solutions are provided according to the disclosure.

It is provided a method for acquiring a time point when a scintillation pulse passes over a threshold, which includes steps of:

(1) converting a relationship between the scintillation pulse and a set threshold into high or low level signals by a comparator, where high-level signals are outputted in a case that the amplitude of the scintillation pulse is higher than the set threshold, or low-level signals are outputted in a case that the amplitude of the scintillation pulse is lower than the set threshold;

(2) segmenting the outputted high or low level signals, where the positive-going scintillation pulse is segmented into five phases: a phase where the scintillation pulse is lower than the set threshold, a phase where the scintillation pulse passes over and is higher than the set threshold, a phase where the scintillation pulse is higher than the set threshold, a phase where the scintillation pulse passes over and is lower than the set threshold and a phase where the scintillation pulse is lower than the set threshold, of which the five phases occur sequentially; the negative-going scintillation pulse is segmented into five phases: a phase where the scintillation pulse is higher than the set threshold, a phase where the scintillation pulse passes over and is lower than the set threshold, a phase where the scintillation pulse is lower than the set threshold, a phase where the scintillation pulse passes over and is higher than the set threshold and a phase where the scintillation pulse is higher than the set threshold, of which the five phases occur sequentially; and (3) recording the time point when the scintillation pulse passes over the set threshold, where no time point when the scintillation pulse passes over the set threshold is recorded and the comparator outputs constant high-level signals or constant low-level signals during the phase where the scintillation pulse is lower than the set threshold and the phase where the scintillation pulse is higher than the set threshold in a case that the scintillation pulse is the positive-going scintillation pulse or the negative-going scintillation pulse; during the phase where the scintillation pulse passes over and is higher than the set threshold, N transitions occur at N time points, one of the N time points, or a median value or a weighted value of any two or more of the N time points is recorded as the time point when the scintillation pulse passes over the set threshold; during the phase where the scintillation pulse passes over and is lower than the set threshold, M transitions occur at M time points, any one of the M time points, or a median value or a weighted value of any two or more of the M time points is recorded as the time point when the scintillation pulse passes over the set threshold, in a case that the scintillation pulse is the positive-going scintillation pulse; during the phase where the scintillation pulse passes over and is lower than the set threshold, P transitions occur at P time points, any one of the P time points, or a median value or a weighted value of any two or more of the P time points is recorded as the time point when the scintillation pulse passes over the set threshold; and during the phase where the scintillation pulse passes over and is higher than the set threshold, S transitions occur at S time points, any one of the S time points, or a median value or a weighted value of any two or more of the S time points is recorded as the time point when the scintillation pulse passes over the set threshold, in a case that the scintillation pulse is the negative-going scintillation pulse.

Preferably, in the above method for acquiring a time point when a scintillation pulse passes over a threshold, in the step (2), in the case that the scintillation pulse is the positive-going scintillation pulse, the level signals in the five phases of the positive-going scintillation pulse respectively have characteristics of: the level signal being a constant low-level signal in the phase where the scintillation pulse is lower than the set threshold; the level signal transiting from a low level to a high level, subsequently repeatedly transiting between a high level and a low level and finally becoming a high level in the phase where the scintillation pulse passes over and is higher than the set threshold; the level signal being a constant high-level signal in the phase where the scintillation pulse is higher than the set threshold; the level signal transiting from a high level to a low level, subsequently repeatedly transiting between a high level and a low level and finally becoming a low level in the phase where the scintillation pulse passes over and is lower than the set threshold; and the level signal being a constant low-level signal in the phase where the scintillation pulse is lower than the set threshold. In the case that the scintillation pulse is the negative-going scintillation pulse, the level signals in the five phases of the negative-going scintillation pulse respectively have characteristics of: the level signal being a constant high-level signal in the phase where the scintillation pulse is higher than the set threshold; the level signal transiting from a high level to a low level, subsequently repeatedly transiting between a high level and a low level and finally becoming a low level in the phase where the scintillation pulse passes over and is lower than the set threshold; the level signal being a constant low-level signal in the phase where the scintillation pulse is lower than the set threshold; the level signal transiting from a low level to a high level, subsequently repeatedly transiting between a high level and a low level and finally becoming a high level in the phase where the scintillation pulse passes over and is higher than the set threshold; the level signal being a constant high-level signal in the phase where the scintillation pulse is higher than the set threshold.

Preferably, in the above method for acquiring a time point when scintillation pulse passes over a threshold, in the step (3), a median value point of the N time points and/or a weighted value of at least a set of time points for transitions from a low level to a high level may be recorded as the time point when the scintillation pulse passes over the set threshold during the phase where the scintillation pulse passes over and is higher than the set threshold, and a median value point of the M time points and/or a weighted value of at least a set of time points for transitions from a high level to a low level may be recorded as the time point when the scintillation pulse passes over the set threshold during the phase where the scintillation pulse passes over and is lower than the set threshold, in the case that the scintillation pulse is the positive-going scintillation pulse; a median value point of the P time points and/or a weighted value of at least a set of time points for transitions from a high level to a low level may be recorded as the time point when the scintillation pulse passes over the set threshold during the phase where the scintillation pulse passes over and is lower than the set threshold, and a median value point of the S time points and/or a weighted value of at least a set of time points for transitions from a low level to a high level may be recorded as the time point when the scintillation pulse passes over the set threshold during the phase where the scintillation pulse passes over and is high than the set threshold, in the case that the scintillation pulse is the negative-going scintillation pulse, where a time point for a first transition from a low level to a high level and a time point for a last transition from a low level to a high level are grouped into a group, a time point for a second transition from a low level to a high level and a time point for a second-to-last transition from a low level to a high level are grouped into a group, and two time points acquired by analogy are grouped into a group; a time point for a first transition from a high level to a low level and a time point for a last transition from a high level to a low level are grouped into a group, a time point for a second transition from a high level to a low level and a time point for a second-to-last transition from a high level to a low level are grouped into a group, and two time points acquired by analogy are grouped into a group.

Preferably, in the above method for acquiring a time point when scintillation pulse passes over a threshold, in the step (3), a weighted value of the time point for the first transition from a low level to a high level and the time point for the last transition from a low level to a high level may be recorded as the time point when the scintillation pulse passes over the set threshold during the phase where the scintillation pulse passes over and is higher than the set threshold, and a weighted value of the time point for the first transition from a high level to a low level and the time point for the last transition from a high level to a low level may be recorded as the time point when the scintillation pulse passes over the set threshold during the phase where the scintillation pulse passes over and is lower than the set threshold, in the case that the scintillation pulse is the positive-going scintillation pulse; and a weighted value of the time point for the first transition from a high level to a low level and the time point for the last transition from a high level to a low level may be recorded as the time point when the scintillation pulse passes over the set threshold during the phase where the scintillation pulse passes over and is lower than the set threshold, and a weighted value of the time point for the first transition from a low level to a high level and the time point for the last transition from a low level to a high level may be recorded as the time point when the scintillation pulse passes over the set threshold during the phase where the scintillation pulse passes over and is higher than the set threshold, in the case that the scintillation pulse is the negative-going scintillation pulse.

Preferably, in the above method for acquiring a time point when scintillation pulse passes over a threshold, in the step (3), a weighted value of the time point for the second transition from a low level to a high level and the time point for the second-to-last transition from a low level to a high level may be recorded as the time point when the scintillation pulse passes over the set threshold during the phase where the scintillation pulse passes over and is higher than the set threshold, and a weighted value of the time point for the second transition from a high level to a low level and the time point for the second-to-last transition from a high level to a low level may be recorded as the time point when the scintillation pulse passes over the set threshold during the phase where the scintillation pulse passes over and is lower than the set threshold, in the case that the scintillation pulse is the positive-going scintillation pulse; and a weighted value of the time point for the second transition from a high level to a low level and the time point for the second-to-last transition from a high level to a low level may be recorded as the time point when the scintillation pulse passes over the set threshold during the phase where the scintillation pulse passes over and is lower than the set threshold, and a weighted value of the time point for the second transition from a low level to a high level and the time point for the second-to-last transition from a low level to a high level may be recorded as the time point when the scintillation pulse passes over the set threshold during the phase where the scintillation pulse passes over and is higher than the set threshold, in the case that the scintillation pulse is the negative-going scintillation pulse.

Preferably, in the above method for acquiring a time point when scintillation pulse passes over a threshold, in the step (3), a weighed value of the N time points may be recorded as the time point when the scintillation pulse passes over the set threshold during the phase where the scintillation pulse passes over and is higher than the set threshold, and a weighed value of the M time points may be recorded as the time point when the scintillation pulse passes over the set threshold during the phase where the scintillation pulse passes over and is lower than the set threshold, in the case that the scintillation pulse is the positive-going scintillation pulse; and a weighed value of the P time points may be recorded as the time point when the scintillation pulse passes over the set threshold during the phase where the scintillation pulse passes over and is lower than the set threshold, and a weighed value of the S time points may be recorded as the time point when the scintillation pulse passes over the set threshold during the phase where the scintillation pulse passes over and is higher than the set threshold, in the case that the scintillation pulse is the negative-going scintillation pulse.

Preferably, in the above method for acquiring a time point when scintillation pulse passes over a threshold, in the step (3), the median value point of the N time points may be recorded as the time point when the scintillation pulse passes over the set threshold during the phase where the scintillation pulse passes over and is higher than the set threshold, and the median value point of the M time points may be recorded as the time point when the scintillation pulse passes over the set threshold during the phase where the scintillation pulse passes over and is lower than the set threshold, in the case that the scintillation pulse is the positive-going scintillation pulse; and the median value point of the P time points may be recorded as the time point when the scintillation pulse passes over the set threshold during the phase where the scintillation pulse passes over and is lower than the set threshold, and the median value point of the S time points may be recorded as the time point when the scintillation pulse passes over the set threshold during the phase where the scintillation pulse passes over and is higher than the set threshold, in the case that the scintillation pulse is the negative-going scintillation pulse.

It is further provided a device for acquiring a time point when scintillation pulse passes over a threshold, which includes:

a comparison unit configured to output level signals based on a relationship between the scintillation pulse and a set threshold, where high-level signals are outputted in a case that an amplitude of the scintillation pulse is higher than the set threshold, or low-level signals are outputted in a case that the amplitude of the scintillation pulse is lower than the set threshold;

a delay chain composed of several cascaded delay elements and configured to receive and output the high-level signals and the low-level signals;

a scintillation pulse state time code recording unit including an uniform-frequency square wave signal, a counter, and a data buffer unit, where the counter is configured to record the number of rising edges of the square wave, the data buffer unit is configured to record output signals of the delay elements in the delay chain at a time instant when the rising edge of the square wave is arrived, the output signals of the delay chain and the number of rising edges of the square wave are combined into a time code;

a time code sorting unit configured to sort the output signals of the delay chain according to a characteristic of the recorded output signals of the delay chain;

a relative time interpretation unit configured to interpret a time interval between a transition of the scintillation pulse and a subsequent rising edge of the square wave;

a time calculation and transmission unit configured to calculate time points for transitions, acquire an accurate time point when the scintillation pulse passes over the set threshold by selecting one of the time points or weighting any two or more of the time points, and transmit the accurate time point to a next unit.

Preferably, in the above device for acquiring a time point when scintillation pulse passes over a threshold, the delay elements in the delay chain may be configured to receive a signal transmitted by a previous cascaded delay element, output an inverse signal of which a state is opposite to that of the received signal, and transmit the inverse signal to a next cascaded delay element after a time interval dt.

Preferably, in the above device for acquiring a time point when scintillation pulse passes over a threshold, a frequency of the uniform-frequency square wave signal of the scintillation pulse state time code recording unit may be in a range from 10 MHz to 20 GHz.

Preferably, in the above device for acquiring a time point when scintillation pulse passes over a threshold, the output signals of the delay chain are sorted by the time code sorting unit into five types of sequences, where a positive-going scintillation pulse is segmented into five phases: a phase where the scintillation pulse is lower than the set threshold, a phase where the scintillation pulse passes over and is higher than the set threshold, a phase where the scintillation pulse is higher than the set threshold, a phase where the scintillation pulse passes over and is lower than the set threshold and a phase where the scintillation pulse is lower than the set threshold, of which the five phases occur sequentially, a negative-going scintillation pulse is segmented into five phases: a phase where the scintillation pulse is higher than the set threshold, a phase where the scintillation pulse passes over and is lower than the set threshold, a phase where the scintillation pulse is lower than the set threshold, a phase where the scintillation pulse passes over and is higher than the set threshold and a phase where the scintillation pulse is higher than the set threshold, of which the five phases occur sequentially. In the case that the scintillation pulse is the positive-going scintillation pulse, the five types of sequences respectively have characteristics of: a sequence consisting of consecutive 1 in the phase where the scintillation pulse is lower than the set threshold; a sequence starting with multiple consecutive s, then switching to 1, subsequently repeatedly switching between 0 and 1, and ending with multiple consecutive 1, from a least significant bit, LSB, to a most significant bit, MSB, in the phase where the scintillation pulse passes over and is higher than the set threshold; a sequence consisting of consecutive 0 in the phase where the scintillation pulse is higher than the set threshold; a sequence starting with multiple consecutive 1, then switching to 0, subsequently repeatedly switching between 0 and 1, and ending with multiple 0, from the LSB to the MSB, in the phase where the scintillation pulse passes over and is lower than the set threshold; and a sequence consisting of consecutive 1 in the phase where the scintillation pulse is lower than the set threshold. In the case that the scintillation pulse is the negative-going scintillation pulse, the five types of sequences respectively have characteristics of: a sequence consisting of consecutive 0 in the phase where the scintillation pulse is higher than the set threshold; a sequence starting with multiple 1, then switching to 0, subsequently repeatedly switching between 0 and 1, and ending with multiple 0 from the LSB to the MSB in the phase where the scintillation pulse passes over and is lower than the set threshold; a sequence consisting of consecutive 1 in the phase where the scintillation pulse is lower than the set threshold; a sequence starting with multiple 0, then switching to 1, subsequently repeatedly switching between 0 and 1 and ending with multiple 1 from the LSB to the MSB in the phase the scintillation pulse passes over and is higher than the set threshold; and a sequence consisting of consecutive 0 in the phase where the scintillation pulse is higher than the set threshold.

Preferably, in the above device for acquiring a time point when a scintillation pulse passes over a threshold, the relative time interpretation unit may be configured to count the number of delay elements until a first 1 occurs from the LSB to the MSB to indicate a time period required for the first transition from a low level to a high level, and the number of delay elements until a last 0 occurs from the LSB to the MSB to indicate a time period required for the last transition from a low level to a high level during the phase where the scintillation pulse passes over and is higher than the set threshold; and to count the number of delay elements until a last 1 occurs from the LSB to the MSB to indicate a time period required for the first transition from a high level to a low level, and the number of delay elements until a first 0 occurs from the LSB to the MSB to indicate a time period required for the last transition from a high level to a low level during the phase where the scintillation pulse passes over and is lower than the set threshold, in the case that the scintillation pulse is the positive-going scintillation pulse; and the relative time interpretation unit may be configured to count the number of delay elements until a first 0 occurs from the LSB to the MSB to indicate a time period required for the first transition from a high level to a low level, and the number of delay elements until a last 1 occurs from the LSB to the MSB to indicate a time period required for the last transition from a high level to a low level during the phase where the scintillation pulse passes over and is lower than the set threshold; and to count the number of delay elements until a last 0 occurs from the LSB to the MSB to indicate a time period required for the first transition from a low level to a high level, and the number of delay elements until a first 1 occurs from the LSB to the MSB to indicate a time period required for the last transition from a low level to a high level during the phase where the scintillation pulse passes over and is higher than the set threshold, in the case that the scintillation pulse is the negative-going scintillation pulse.

As can be seen from the above technical solution, with the method and the device for acquiring a time point when a scintillation pulse passes over a threshold, multiple time points for transitions may be acquired, a more accurate time point when the scintillation pulse passes over the threshold may be acquired by selecting one of the time points for transitions or weighting two or more of the time points for transitions. Particularly, a more accurate time point when the scintillation pulse actually passes over the threshold may be acquired by acquiring a time point when a first transition occurs and a time point when a last transition occurs during the time period where the scintillation pulse passes over the threshold and weighting the two time points. According to the disclosure, the time point for the first transition, the time point for the last transition and any of the time points for transitions between the first transition and the last transition may be acquired by analyzing the outputted signals of the delay chain to acquire time points when transitions from 0 to 1 or 1 to 0 occur and relationships between the time points.

BRIEF DESCRIPTION OF THE DRAWINGS

In order to illustrate the technical solutions according to the embodiments of the present disclosure or in the conventional art more clearly, drawings to be used in the description of the embodiments or the conventional art are described briefly hereinafter. Apparently, the drawings described hereinafter are only some embodiments of the present disclosure, and other drawings may be obtained by those skilled in the art according to those drawings without creative effort.

DETAILED DESCRIPTION OF THE EMBODIMENTS

Figure 1:
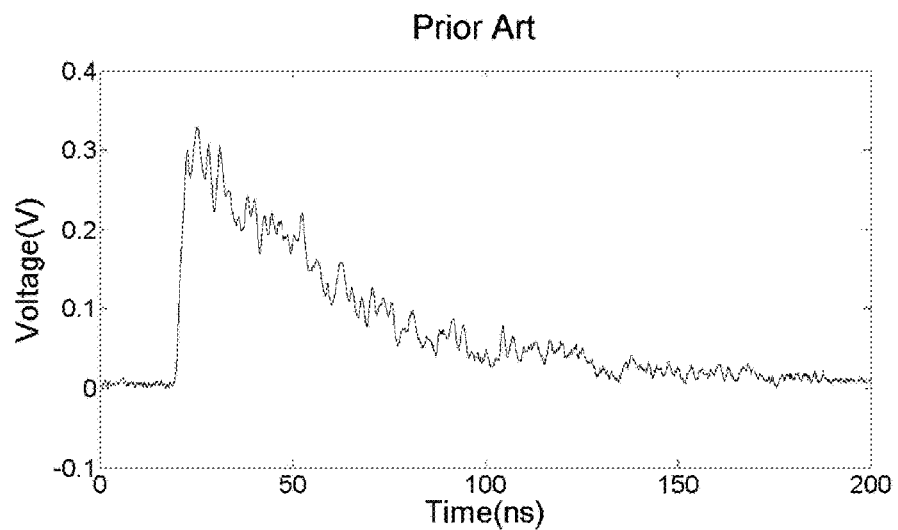
FIG. 1 is a schematic diagram of a waveform of a typical scintillation pulse in the conventional technology.
Figure 2:
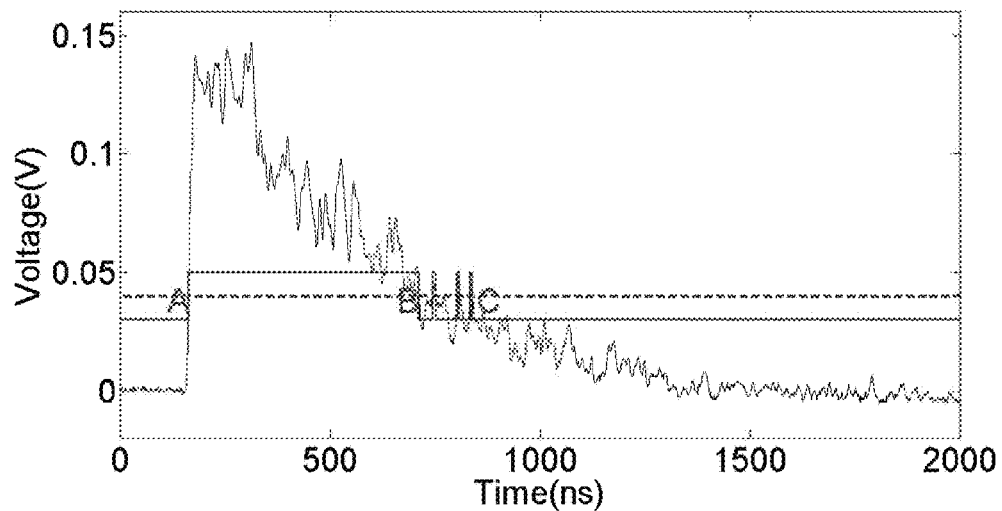
FIG. 2 is a schematic diagram of a waveform of another scintillation pulse in the conventional technology.

A method and a device for acquiring a time point when a scintillation pulse passes over a threshold are provided according to the disclosure, so as to solve the issue that the time point can not be acquired accurately due to noises.

The technical solutions in the embodiments of the present disclosure are described in detail hereinafter in conjunction with the drawings in the embodiments of the present disclosure. Apparently, the described embodiments are only some but not all of the embodiments of the present disclosure. All the other embodiments obtained by those ordinary skilled in the art based on the embodiments of the present disclosure without creative effort fall within the scope of protection of the present disclosure.

Both a positive-going pulse signal and a negative-going pulse signal are described in the disclosure since the scintillation pulse signal may be the positive-going or negative-going pulse signal.

The method for acquiring a time point when a scintillation pulse passes over a threshold according to the disclosure includes the following steps (1) to (3).

In step (1), a relationship between the scintillation pulse and a set threshold is converted by a comparator into a level signal, where high-level signals are outputted in a case that the amplitude of the scintillation pulse is higher than the set threshold, or low-level signals are outputted in a case that the amplitude of the scintillation pulse is lower than the set threshold.

In step (2), the outputted level signals are segmented, where a positive-going scintillation pulse is segmented into five phases: a phase where the scintillation pulse is lower than the set threshold, a phase where the scintillation pulse passes over and is higher than the set threshold, a phase where the scintillation pulse is higher than the set threshold, a phase where the scintillation pulse passes over and is lower than the set threshold and a phase where the scintillation pulse is lower than the set threshold, of which the five phases occur sequentially, a negative-going scintillation pulse is segmented into five phases: a phase where the scintillation pulse is higher than the set threshold, a phase where the scintillation pulse passes over and is lower than the set threshold, a phase where the scintillation pulse is lower than the set threshold, a phase where the scintillation pulse passes over and is higher than the set threshold and a phase where the scintillation pulse is higher than the set threshold, of which the five phases occur sequentially.

In a case that the scintillation pulse signal is the positive-going pulse signal, the outputted level signals in the five phases of the positive-going scintillation pulse respectively have characteristics of: the level signal being a constant low-level signal in the phase where the scintillation pulse is lower than the set threshold; the level signal transiting from a low level to a high level, subsequently repeatedly transiting between a high level and a low level and finally becoming a high level in the phase where the scintillation pulse passes over and is higher than the set threshold; the level signal being a constant high-level signal in the phase where the scintillation pulse is higher than the set threshold; the level signal transiting from a high level to a low level; subsequently repeatedly transiting between a high level and a low level and finally becoming a low level in the phase where the scintillation pulse passes over and is lower than the set threshold; and the level signal being a constant low-level signal in the phase where the scintillation pulse is lower than the set threshold.

In a case that the scintillation pulse signal is the negative-going pulse signal, the outputted level signals in the five phases of the negative-going scintillation pulse respectively have characteristics of: the level signal being a constant high-level signal in the phase where the scintillation pulse is higher than the set threshold; the level signal transiting from a high level to a low level, subsequently repeatedly transiting between a high level and a low level and finally becoming a low level in the phase where the scintillation pulse passes over and is lower than the set threshold; the level signal being a constant low-level signal in the phase where the scintillation pulse is lower than the set threshold; the level signal transiting from a low level to a high level, subsequently repeatedly transiting between a high level and a low level and finally becoming a high level in the phase where the scintillation pulse passes over and is higher than the set threshold; and the level signal being a constant high-level signal in the phase where the scintillation pulse is higher than the set threshold.

In step (3), the time point when the scintillation pulse passes over the set threshold is recorded. In a case that the scintillation pulse is the positive-going scintillation pulse or the negative-going scintillation pulse, during the phase where the scintillation pulse is lower than the set threshold and the phase where the scintillation pulse is higher than the set threshold, the comparator outputs a constant level (a high-level signal or low-level signal), and no time point is recorded during the two phases. The time point is recorded only in a case that the scintillation pulse passes over the threshold and triggers the comparator to output a level signal which transits between a high level and a low level. Therefore, no time point when the scintillation pulse passes over the set threshold is recorded during the two phases. In a case that the scintillation pulse is the positive-going scintillation pulse, during the phase where the scintillation pulse passes over and is higher than the set threshold, N transitions may occur at N time points, and any one of the N time points, or a median value or a weighted value of any two or more of the N time points is recorded as the time point when the scintillation pulse passes over the set threshold; during the phase where the scintillation pulse passes over and is lower than the set threshold, M transitions may occur at M time points, and any one of the M time points, or a median value or a weighted value of any two or more of the M time points is recorded as the time point when the scintillation pulse passes over the set threshold. In a case that the scintillation pulse is the negative-going scintillation pulse, during the phase where the scintillation pulse passes over and is lower than the set threshold, P transitions may occur at P time points, and any one of the P time points, or a median value or a weighted value of any two or more of the P time points is recorded as the time point when the scintillation pulse passes over the set threshold; during the phase where the scintillation pulse passes over and is higher than the set threshold, S transitions may occur at S time points, and any one of the S time points, or a median value or a weighted value of any two or more of the S time points is recorded as the time point when the scintillation pulse passes over the set threshold.

As can be seen from the description of step (3), according to the disclosure, after N (M, P, or S) time points when N transitions occur are acquired, the weighted value or the median value point of some (one, two or n continuous or non-continuous time points of the N (M, P, or S) time points which are sampled regularly or irregularly) or all of N (M, P, or S) time points may be used to indicate an accurate time point.

A further preferable scope of the disclosure regarding step (3) includes: a median value point of the N time points and/or a weighted value of at least a set of time points for transitions from a low level to a high level is recorded as the time point when the scintillation pulse passes over the set threshold during the phase where the scintillation pulse passes over and is higher than the set threshold, and a median value point of the M time points and/or a weighted value of at least a set of time points for transitions from a high level to a low level is recorded as the time point when the scintillation pulse passes over the set threshold during the phase where the scintillation pulse passes over and is lower than the set threshold, in the case that the scintillation pulse is the positive-going scintillation pulse; and a median value point of the P time points and/or a weighted value of at least a set of time points for transitions from a high level to a low level is recorded as the time point when the scintillation pulse passes over the set threshold during the phase where the scintillation pulse passes over and is lower than the set threshold, and a median value point of the S time points and/or a weighted value of at least a set of time points for transitions from a low level to a high level is recorded as the time point when the scintillation pulse passes over the set threshold during the phase where the scintillation pulse passes over and is high than the set threshold, in the case that the scintillation pulse is the negative-going scintillation pulse.

A time point for a first transition from a low level to a high level and a time point for a last transition from a low level to a high level are grouped into a group, a time point for a second transition from a low level to a high level and a time point for a second-to-last transition from a low level to a high level are grouped into a group, and two time points acquired by analogy are grouped into a group; a time point for a first transition from a high level to a low level and a time point for a last transition from a high level to a low level are grouped into a group, a time point for a second transition from a high level to a low level and a time point for a second-to-last transition from a high level to a low level are grouped into a group, and two time points acquired by analogy are grouped into a group.

A first further preferable scope of the disclosure regarding step (3) includes: a weighted value of the time point for the first transition from a low level to a high level and the time point for the last transition from a low level to a high level is recorded as the time point when the scintillation pulse passes over the set threshold during the phase where the scintillation pulse passes over and is higher than the set threshold, and a weighted value of the time point for the first transition from a high level to a low level and the time point for the last transition from a high level to a low level is recorded as the time point when the scintillation pulse passes over the set threshold during the phase where the scintillation pulse passes over and is lower than the set threshold, in the case that the scintillation pulse is the positive-going scintillation pulse; and a weighted value of the time point for the first transition from a high level to a low level and the time point for the last transition from a high level to a low level is recorded as the time point when the scintillation pulse passes over the set threshold during the phase where the scintillation pulse passes over and is lower than the set threshold, and a weighted value of the time point for the first transition from a low level to a high level and the time point for the last transition from a low level to a high level is recorded as the time point when the scintillation pulse passes over the set threshold during the phase where the scintillation pulse passes over and is higher than the set threshold, in the case that the scintillation pulse is the negative-going scintillation pulse.

A second further preferable scope of the disclosure regarding step (3) includes: a weighted value of the time point for the second transition from a low level to a high level and the time point for the second-to-last transition from a low level to a high level is recorded as the time point when the scintillation pulse passes over the set threshold during the phase where the scintillation pulse passes over and is higher than the set threshold, and a weighted value of the time point for the second transition from a high level to a low level and the time point for the second-to-last transition from a high level to a low level is recorded as the time point when the scintillation pulse passes over the set threshold during the phase where the scintillation pulse passes over and is lower than the set threshold, in the case that the scintillation pulse is the positive-going scintillation pulse; and a weighted value of the time point for the second transition from a high level to a low level and the time point for the second-to-last transition from a high level to a low level is recorded as the time point when the scintillation pulse passes over the set threshold during the phase where the scintillation pulse passes over and is lower than the set threshold, and a weighted value of the time point for the second transition from a low level to a high level and the time point for the second-to-last transition from a low level to a high level is recorded as the time point when the scintillation pulse passes over the set threshold during the phase where the scintillation pulse passes over and is higher than the set threshold, in the case that the scintillation pulse is the negative-going scintillation pulse.

A third further preferable scope of the disclosure regarding step (3) includes: a weighed value of the N time points is recorded as the time point when the scintillation pulse passes over the set threshold during the phase where the scintillation pulse passes over and is higher than the set threshold, and a weighed value of the M time points is recorded as the time point when the scintillation pulse passes over the set threshold during the phase where the scintillation pulse passes over and is lower than the set threshold, in the case that the scintillation pulse is the positive-going scintillation pulse; and a weighed value of the P time points is recorded as the time point when the scintillation pulse passes over the set threshold during the phase where the scintillation pulse passes over and is lower than the set threshold, and a weighed value of the S time points is recorded as the time point when the scintillation pulse passes over the set threshold during the phase where the scintillation pulse passes over and is higher than the set threshold, in the case that the scintillation pulse is the negative-going scintillation pulse.

A fourth further preferable scope of the disclosure regarding step (3) includes: the median value point of the N time points is recorded as the time point when the scintillation pulse passes over the set threshold during the phase where the scintillation pulse passes over and is higher than the set threshold, and the median value point of the M time points is recorded as the time point when the scintillation pulse passes over the set threshold during the phase where the scintillation pulse passes over and is lower than the set threshold, in a case that the scintillation pulse is the positive-going scintillation pulse; and the median value point of the P time points is recorded as the time point when the scintillation pulse passes over the set threshold during the phase where the scintillation pulse passes over and is lower than the set threshold, and the median value point of the S time points is recorded as the time point when the scintillation pulse passes over the set threshold during the phase where the scintillation pulse passes over and is higher than the set threshold, in the case that the scintillation pulse is the negative-going scintillation pulse.

The above median value point is defined as follows. A sequence of data points $x(i)$, $i=1, 2, \ldots, n$, are ordered by value, and a data point in the middle of the sequence is outputted as the median value point. In a case that n is an odd number, the data point in the middle of the sequence is outputted; or in a case that n is an even number, an average value of two data points in the middle of the sequence is outputted as the median value point.

The above median value point indicates the time point when a middle transition occurs. For example, given that the number of transitions M is equal to 8, the median value point is an average value of the time point for a fourth transition and the time point for a fifth transition. As another example, given that the number of transitions M is equal to 7, the median value point is the time point for a fourth transition. The median value point for N transitions may be calculated in the same way.

In summary, in the technical solution of the disclosure, the time point when the scintillation pulse passes over the set threshold may be acquired by weighting the time point for the first transition and the time point for the last transition, or may be acquired by weighting the time point for the second transition and the time point for the second-to-last transition and the like. Moreover, the time point when the scintillation pulse passes over the set threshold may be acquired by acquiring all of the time points for transitions during the phases where the scintillation pulse passes over the set threshold and weighing all of the time points, may be acquired by acquiring the median value point of all of the time points, or even may be acquired through a likelihood estimation approach.

According to the disclosure, generally the time point for the first transition, the time point for the last transition and all of time points for the transitions between the first transition and the last transition are acquired by analyzing the outputted signals of the delay chain to acquire time points when transitions from 0 to 1 or 1 to 0 occur and relationships between the time points.

A device for acquiring a time point when a scintillation pulse passes over a threshold is further disclosed according to the disclosure, which includes a comparison unit, a delay chain, a scintillation pulse state time code recording unit, a time code sorting unit, a relative time interpretation unit and a time calculation and transmission unit.

The comparison unit is configured to output level signals based on a relationship between the scintillation pulse and a set threshold, where high-level signals are outputted in a case that an amplitude of the scintillation pulse is higher than the set threshold, or low-level signals are outputted in a case that the amplitude of the scintillation pulse is lower than the set threshold.

The delay chain is composed of several cascaded delay elements and configured to receive and output the high-level signals and the low-level signals. The delay elements in the delay chain is configured to receive a signal transmitted by a previous cascaded delay element, output an inverse signal of which a state is opposite to that of the received signal, and transmit the inverse signal to a next cascaded delay element after a time interval dt.

The scintillation pulse state time code recording unit includes an uniform-frequency square wave signal, a counter, and a data buffer unit, where the counter is configured to record the number of rising edges of the square wave, the data buffer unit is configured to record output signals of the delay elements in the delay chain at a time instant when the rising edge of the square wave is arrived, the output signals of the delay chain and the number of rising edges of the square wave are combined into a time code.

A frequency of the uniform-frequency square wave signal of the scintillation pulse state time code recording unit is in a range from 10 MHz to 20 GHz.

The counter is configured to record the number of rising edges of the square wave, the data buffer unit is configured to record output signals of the delay elements in the delay chain at a time instant when the rising edge of the square wave is arrived, the output signals of the delay chain and the number of rising edges of the square wave are combined into a time code.

The time code sorting unit is configured to sort the output signals of the delay chain according to a characteristic of the recorded output signals of the delay chain. Output signals of the delay chain may be sorted by the time code sorting unit into five types of sequences, where a positive-going scintillation pulse is segmented into five phases: a phase where the scintillation pulse is lower than the set threshold, a phase where the scintillation pulse passes over and is higher than the set threshold, a phase where the scintillation pulse is higher than the set threshold, a phase where the scintillation pulse passes over and is lower than the set threshold and a phase where the scintillation pulse is lower than the set threshold, of which the five phases occur sequentially, a negative-going scintillation pulse is segmented into five phases: a phase where the scintillation pulse is higher than the set threshold, a phase where the scintillation pulse passes over and is lower than the set threshold, a phase where the scintillation pulse is lower than the set threshold, a phase where the scintillation pulse passes over and is higher than the set threshold and a phase where the scintillation pulse is higher than the set threshold, of which the five phases occur sequentially.

In the case that the scintillation pulse is the positive-going scintillation pulse, the five types of sequences respectively have characteristics of: a sequence consisting of consecutive 1 in the phase where the scintillation pulse is lower than the set threshold; a sequence starting with multiple consecutive 0, then switching to 1, subsequently repeatedly switching between 0 and 1, and ending with multiple consecutive 1, from a least significant bit, LSB, to a most significant bit, MSB, in the phase where the scintillation pulse passes over and is higher than the set threshold; a sequence consisting of consecutive 0 in the phase where the scintillation pulse is higher than the set threshold; a sequence starting with multiple consecutive 1, then switching to 0, subsequently repeatedly switching between 0 and 1, and ending with multiple 0 from the LSB to the MSB in the phase where the scintillation pulse passes over and is lower than the set threshold; and a sequence consisting of consecutive 1 in the phase where the scintillation pulse is lower than the set threshold.

In the case that the scintillation pulse is the negative-going scintillation pulse, the five types of sequences respectively have characteristics of: a sequence consisting of consecutive 0 in the phase where the scintillation pulse is higher than the set threshold; a sequence starting with multiple 1, then switching to 0, subsequently repeatedly switching between 0 and 1, and ending with multiple 0 from the LSB to the MSB in the phase where the scintillation pulse passes over and is lower than the set threshold; a sequence consisting of consecutive 1 in the phase where the scintillation pulse is lower than the set threshold; a sequence starting with multiple 0, then switching to 1, subsequently repeatedly switching between 0 and 1, and ending with multiple 1 from the LSB to the MSB in the phase the scintillation pulse passes over and is higher than the set threshold; and a sequence consisting of consecutive 0 in the phase where the scintillation pulse is higher than the set threshold.

The relative time interpretation unit is configured to interpret a time interval between a transition of the scintillation pulse and a subsequent rising edge of the square wave.

The relative time interpretation unit is configured to count the number of delay elements until a first 1 occurs from the LSB to the MSB to indicate a time period required for the first transition from a low level to a high level, and the number of delay elements until a last 0 occurs from the LSB to the MSB to indicate a time period required for the last transition from a low level to a high level during the phase where the scintillation pulse passes over and is higher than the set threshold; and to count the number of delay elements until a last 1 occurs from the LSB to the MSB to indicate a time period required for the first transition from a high level to a low level, and the number of delay elements until a first 0 occurs from the LSB to the MSB to indicate a time period required for the last transition from a high level to a low level during the phase where the scintillation pulse passes over and is lower than the set threshold, in the case that the scintillation pulse is the positive-going scintillation pulse.

The relative time interpretation unit is configured to count the number of delay elements until a first 0 occurs from the LSB to the MSB to indicate a time period required for the first transition from a high level to a low level, and the number of delay elements until a last 1 occurs from the LSB to the MSB to indicate a time period required for the last transition from a high level to a low level during the phase where the scintillation pulse passes over and is lower than the set threshold; and to count the number of delay elements until a last 0 occurs from the LSB to the MSB to indicate a time period required for the first transition from a low level to a high level, and the number of delay elements until a first 1 occurs from the LSB to the MSB to indicate a time period required for the last transition from a low level to a high level during the phase where the scintillation pulse passes over and is higher than the set threshold, in the case that the scintillation pulse is the negative-going scintillation pulse.

The time calculation and transmission unit is configured to calculate time points for transitions according to time information acquired by the relative time interpretation unit, acquire an accurate time point when the scintillation pulse passes over the set threshold by selecting one of the time points or weighting any two or more of the time points and transmit the accurate time point to a next unit.

Hereinafter, the disclosure is described in more detail in conjunction with several specific examples.

Figure 3:
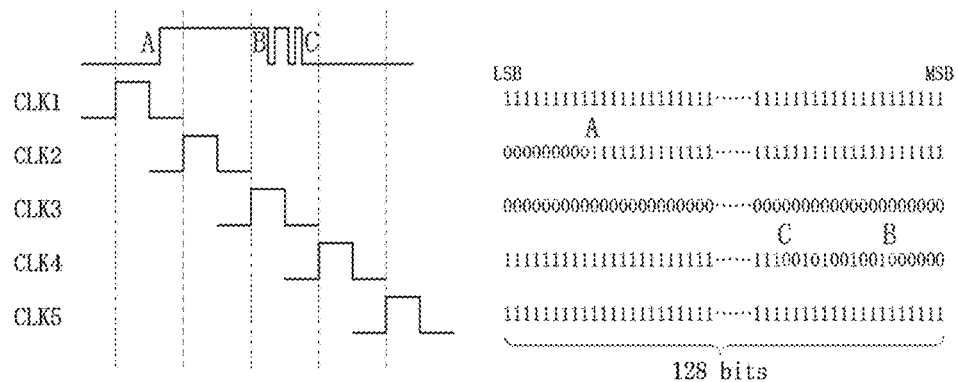
FIG. 3 is a schematic diagram of logical output signals outputted by a comparator in which the scintillation pulse shown in FIG. 2 is inputted and states of corresponding signals outputted by the delay chain from a least significant bit (LSB) to a most significant bit (MSB)

FIG. 3 is a schematic diagram of logical output signals outputted by a comparator in which the scintillation pulse is inputted and states of the signals outputted by the delay chain from a least significant bit (LSB) to a most significant bit (MSB). In this embodiment, time information on the scintillation pulse passing a reference threshold voltage is captured. A rising edge of the scintillation pulse is not affected by noises, and thus the state of the logic signal transits only once until being maintained at a logic high level stably during the phase where the scintillation pulse passes over and is higher than the threshold; a falling edge of the scintillation pulse is affected by noises, and thus the state of the logic output signal transits once and switches for multiple times until being maintained at a logic low level during the phase where the scintillation pulse passes over and is lower than the threshold. A, B and C shown in FIG. 3 represent a rising edge of the logic output signal when the pulse passes over and is higher than the threshold, a first falling edge of the logic output signal and a final falling edge of the logic output signal when the pulse passes over and is lower than the threshold respectively. The logic output signal is inputted into a delay chain. Output signals outputted by the delay chain at different rising edges of a clock signal are shown in the left side of FIG. 3. For this case, three delay chains are used in this example to record time points when A, B and C occurs respectively, and three different encoding modes are used for the three delay chains. The delay chain for capturing the time point when A occurs consists of m cascading adders, where an augend of the adder at each stage is set to 1, and an addend of the adder at each stage is set to 0. When the logic level outputted by the comparator connected to a carry input of a first-stage adder in the carry chain transits from a low level to a high level, the output Sum of the adder transits from a high level to a low level, as indicated by A shown in FIG. 3. The number N of consecutive 0 outputted by the delay chain from a least significant bit (LSB) to a most significant bit (MSB) is coded using a priority encoder. Given that a delay of the adders is T, a time interval between A and a current rising edge of the clock signal is N*T. The carry chain for capturing the time point when B occurs consists of m cascading adders, where an augend of the adder at each stage is set to 1, and an addend of the adder at each stage is set to 0. When the logic level outputted by the comparator connected to a carry input of a first-stage adder in the carry chain transits a low level to a high level, the output Sum of the adder transits from a high level to a low level, as indicated by B shown in FIG. 3. The number N of consecutive 0 outputted by the delay chain from a most significant bit (MSB) to a least significant bit (LSB) is coded. Given that a delay of the adders is T, a time interval between B and a current rising edge of the clock signal is N*T. The carry chain for capturing the time point when C occurs consists of m cascading adders, where an augend of the adder at each stage is set to 1, and an addend of the adder at each stage is set to 0. When the logic level outputted by the comparator connected to a carry input of a first-stage adder in the carry chain transits from a low level to a high level, the output Sum of the adder transits from a high level to a low level, as indicated by C shown in FIG. 3. The number N of consecutive 1 outputted by the delay chain from a least significant bit (LSB) to a most significant bit (MSB) is coded. Given that a delay of the adders is T, a time interval between C and a current rising edge of the clock signal is (m−N)*T.

Figure 4:
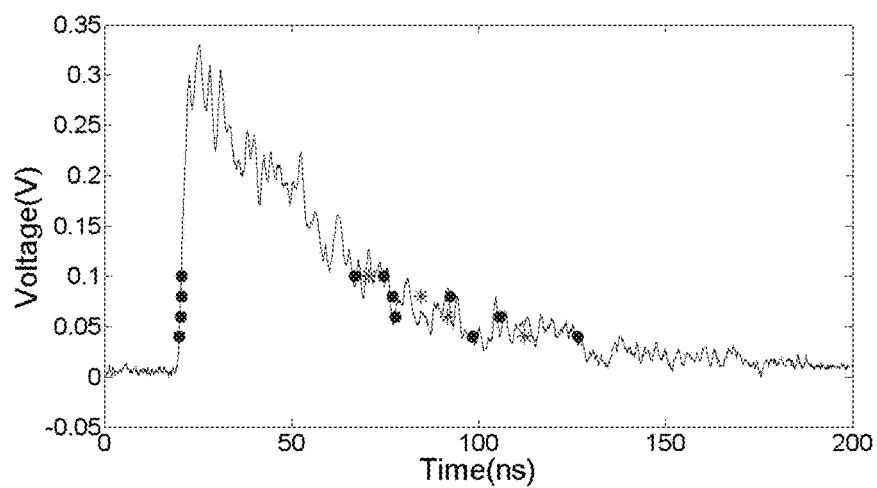
FIG. 4 is a schematic diagram of sampled time points acquired at four different thresholds with a method for acquiring a time point when a scintillation pulse passes over a threshold according to the disclosure.

The time points for A, B, and C may be acquired based on the time intervals acquired in the above way in conjunction with the number of cycles of the clock signal recorded by a clock counter. Sampled time points acquired at different thresholds with the method according to the disclosure are shown in FIG. 4 (Four results acquired at four different thresholds are shown in FIG. 4, and the method according to the disclosure is used to acquire the sampled time points at the different thresholds), where a round spot indicates a actually acquired sampled time point. Considering noises in the falling edge of the scintillation pulse, an actual time point when the scintillation pulse passes over the threshold is acquired by weighting two sampled time point acquired in the falling edge of the scintillation pulse. The actual time point is marked with an asterisk, as shown in FIG. 4.

A method is provided to solve the issue of inaccurate sampling of voltage-time pairs due to noises. In a traditional method, noises in the falling edge of the scintillation pulse are not considered, and a first transition edge is recorded as the time point when the scintillation pulse passes over the threshold. With this method, the collected time point is invariably earlier than the actual time point when the scintillation pulse passes over the threshold in the presence of noises, and thus the accuracy of the collection is reduced.

A method for acquiring time points for all of the transition edges during the phase where the scintillation pulse passes over the threshold is proposed in accordance with the disclosure, and a more accurate time point when the scintillation pulse passes over the threshold are acquired with a weighting process. A pulse shape may be restored more accurately by analyzing and processing the acquired time points for N (M, P, or S) transitions, thereby reducing the effect of noises on pulse restoration.

According to the disclosure, the time points for the transitions are acquired mainly by analyzing states of signals outputted by the carry chain.

According to the disclosure, the time point for the first transition edge and the time point for the last transition edge are acquired, and the actual time point when the scintillation pulse passes over the threshold may be more accurately acquired by weighting the two time points for transition edges.

With the method and device for acquiring a time point when a scintillation pulse passes over a threshold, the actual time point when the scintillation pulse passes over the threshold may be more accurately acquired by acquiring a median value point of the acquired multiple time points for transition edges and/or by weighting at least a set of time points for transition edges.

According to the disclosure, the time point for the first transition, the time point for the last transition and all of the time points for transitions between the first transition and the last transition may be acquired by analyzing the outputted signals of the delay chain to acquire time points when transitions from 0 to 1 or 1 to 0 occur and relationships between the time points.

It is apparent to those skilled in the art that the disclosure is not limited to the details of the foregoing illustrative embodiments, and the present disclosure may be embodied in other specific embodiments without departing from the spirit or essential attributes thereof. The embodiments are therefore considered in all respects to be illustrative and not restrictive, the scope of the disclosure is indicated by the appended claims rather than by the foregoing description, and thus all changes which fall within the meaning and range of equivalency of the claims are intended to be embraced in the disclosure. Any reference numerals in the claims should not be construed as limiting the claims.

Furthermore, it should be understood that although this specification is described with reference to the embodiments, each of the embodiments does not include only one independent technical solution. The specification is described in this manner just for the sake of clarity. Those skilled in the art should take the specification as a whole, and the technical solutions in the embodiments may be appropriately combined to form other embodiments which may be understood by those skilled in the art.

What is claimed is:

1. A method for acquiring a time point when a scintillation pulse passes over a threshold, comprising:

converting a relationship between the scintillation pulse and a set threshold into level signals by a comparator, wherein high-level signals are outputted in a case that an amplitude of the scintillation pulse is higher than the set threshold, or low-level signals are outputted in a case that the amplitude of the scintillation pulse is lower than the set threshold;

segmenting the outputted high or low level signals, wherein a positive-going scintillation pulse is segmented into five phases: a first phase where the scintillation pulse is lower than the set threshold, a second phase where the scintillation pulse passes over and is higher than the set threshold, a third phase where the scintillation pulse is higher than the set threshold, a fourth phase where the scintillation pulse passes over and is lower than the set threshold and a fifth phase where the scintillation pulse is lower than the set threshold, of which the five phases occur sequentially; a negative-going scintillation pulse is segmented into five phases: a first phase where the scintillation pulse is higher than the set threshold, a second phase where the scintillation pulse passes over and is lower than the set threshold, a third phase where the scintillation pulse is lower than the set threshold, a fourth phase where the scintillation pulse passes over and is higher than the set threshold and a fifth phase where the scintillation pulse is higher than the set threshold, of which the five phases occur sequentially; and recording the time point when the scintillation pulse passes over the set threshold, wherein no time point when the scintillation pulse passes over the set threshold is recorded and the comparator outputs constant high-level signals or constant low-level signals during a phase of the five phases where the scintillation pulse is lower than the set threshold, and a phase of the five phases where the scintillation pulse is higher than the set threshold in a case that the scintillation pulse is the positive-going scintillation pulse or the negative-going scintillation pulse;

during the second phase where the scintillation pulse passes over and is higher than the set threshold, N transitions occur at N time points, one of the N time points, or a median value or a weighted value of any two or more of the N time points is recorded as the time point when the scintillation pulse passes over the set threshold; during the fourth phase where the scintillation pulse passes over and is lower than the set threshold, M transitions occur at M time points, any one of the M time points, or a median value or a weighted value of any two or more of the M time points is recorded as the time point when the scintillation pulse passes over the set threshold, in a case that the scintillation pulse is the positive-going scintillation pulse; and during the second phase where the scintillation pulse passes over and is lower than the set threshold, P transitions occur at P time points, any one of the P time points, or a median value or a weighted value of any two or more of the P time points is recorded as the time point when the scintillation pulse passes over the set threshold; and during the fourth phase where the scintillation pulse passes over and is higher than the set threshold, S transitions occur at S time points, any one of the S time points, or a median value or a weighted value of any two or more of the S time points is recorded as the time point when the scintillation pulse passes over the set threshold, in a case that the scintillation pulse is the negative-going scintillation pulse.

2. The method for acquiring a time point when a scintillation pulse passes over threshold according to claim 1, wherein in the case that the scintillation pulse is the positive-going scintillation pulse, the level signals in the five phases of the positive-going scintillation pulse respectively have characteristics of: the level signal being a constant low-level signal; the level signal transiting from a low level to a high level, subsequently repeatedly transiting between a high level and a low level and finally becoming a high level; the level signal being a constant high-level signal; the level signal transiting from a high level to a low level, subsequently repeatedly transiting between a high level and a low level and finally becoming a low level; and the level signal being a constant low-level signal; and in the case that the scintillation pulse is the negative-going scintillation pulse, the level signals in the five phases of the negative-going scintillation pulse respectively have characteristics of: the level signal being a constant high-level signal; the level, signal transiting from a high level to a low level, subsequently repeatedly transiting between a high level and a low level and finally becoming a low level; the level signal being a constant low-level signal; the level signal transiting from a low level to a high level, subsequently repeatedly transiting between a high level and a low level and finally becoming a high level; and the level signal being a constant high-level signal.

3. The method for acquiring a time point when a scintillation pulse passes over a threshold according to claim 1, wherein a median value point of the N time points and/or a weighted value of at least a set of time points for transitions from a low level to a high level is recorded as the time point when the scintillation pulse passes over the set threshold during the second phase where the scintillation pulse passes over and is higher than the set threshold, and a median value point of the M time points and/or a weighted value of at least a set of time points for transitions from a high level to a low level is recorded as the time point when the scintillation pulse passes over the set threshold during the fourth phase where the scintillation pulse passes over and is lower than the set threshold, in the case that the scintillation pulse is the positive-going scintillation pulse; and a median value point of the P time points and/or a weighted value of at least a set of time points for transitions from a high level to a low level is recorded as the time point when the scintillation pulse passes over the set threshold during the second phase where the scintillation pulse passes over and is lower than the set threshold, and a median value point of the S time points and/or a weighted value of at least a set of time points for transitions from a low level to a high level is recorded as the time point when the scintillation pulse passes over the set threshold during the fourth phase where the scintillation pulse passes over and is high than the set threshold, in the case that the scintillation pulse is the negative-going scintillation pulse, wherein a time point for a first transition from a low level to a high level and a time point for a last transition from a low level to a high level are grouped into a group, a time point for a second transition from a low level to a high level and a time point for a second-to-last transition from a low level to a high level are grouped into a group, and two time points acquired by analogy are grouped into a group; a time point for a first transition from a high level to a low level and a time point for a last transition from a high level to a low level are grouped into a group, a time point for a second transition from a high level to a low level and a time point for a second-to-last transition from a high level to a low level are grouped into a group, and two time points acquired by analogy are grouped into a group.

4. The method for acquiring a time point when a scintillation pulse passes over a threshold according to claim 3, wherein a weighted value of the time point for the first transition from a low level to a high level and the time point for the last transition from a low level to a high level is recorded as the time point when the scintillation pulse passes over the set threshold during the second phase where the scintillation pulse passes over and is higher than the set threshold, and a weighted value of the time point for the first transition from a high level to a low level and the time point for the last transition from a high level to a low level is recorded as the time point when the scintillation pulse passes over the set threshold during the fourth phase where the scintillation pulse passes over and is lower than the set threshold, in the case that the scintillation pulse is the positive-going scintillation pulse; and a weighted value of the time point for the first transition from a high level to a low level and the time point for the last transition from a high level to a low level is recorded as the time point when the scintillation pulse passes over the set threshold during the second phase where the scintillation pulse passes over and is lower than the set threshold, and a weighted value of the time point for the first transition from a low level to a high level and the time point for the last transition from a low level to a high level is recorded as the time point when the scintillation pulse passes over the set threshold during the fourth phase where the scintillation pulse passes over and is higher than the set threshold, in the case that the scintillation pulse is the negative-going scintillation pulse.

5. The method for acquiring a time point when a scintillation pulse passes over a threshold according to claim 3, wherein a weighted value of the time point for the second transition from a low level to a high level and the time point for the second-to-last transition from a low level to a high level is recorded as the time point when the scintillation pulse passes over the set threshold during the second phase where the scintillation pulse passes over and is higher than the set threshold, and a weighted value of the time point for the second transition from a high level to a low level and the time point for the second-to-last transition from a high level to a low level is recorded as the time point when the scintillation pulse passes over the set threshold during the fourth phase where the scintillation pulse passes over and is lower than, the set threshold, in the case that the scintillation pulse is the positive-going scintillation pulse; and a weighted value of the time point for the second transition from a high level to a low level and the time point for the second-to-last transition from a high level to a low level is recorded as the time point when the scintillation pulse passes over the set threshold during the second phase where the scintillation pulse passes over and is lower than the set threshold, and a weighted value of the time point for the second transition from a low level to a high level and the time point for the second-to-last transition from a low level to a high level is recorded as the time point when the scintillation pulse passes over the set threshold during the fourth phase where the scintillation pulse passes over and is higher than the set threshold, in the case that the scintillation pulse is the negative-going scintillation pulse.

6. The method for acquiring a time point when a scintillation pulse passes over a threshold according to claim 3, wherein a weighed value of the N time points is recorded as the time point when the scintillation pulse passes over the set threshold during the second phase where the scintillation pulse passes over and is higher than the set threshold, and a weighed value of the M time points is recorded as the time point when the scintillation pulse passes over the set threshold during the fourth phase where the scintillation pulse passes over and is lower than the set threshold, in the case that the scintillation pulse is the positive-going scintillation pulse; and a weighed value of the P time points is recorded as the time point when the scintillation pulse passes over the set threshold during the second phase where the scintillation pulse passes over and is lower than the set threshold, and a weighed value of the S time points is recorded as the time point when the scintillation pulse passes over the set threshold during the fourth phase where the scintillation pulse passes over and is higher than the set threshold, in the case that the scintillation pulse is the negative-going scintillation pulse.

7. The method for acquiring a time point when a scintillation pulse passes over a threshold according to claim 3, wherein the median value point of the N time points is recorded as the time point when the scintillation pulse passes over the set threshold during the second phase where the scintillation pulse passes over and is higher than the set threshold, and the median value point of the M time points is recorded as the time point when the scintillation pulse passes over the set threshold during the fourth phase where the scintillation pulse passes over and is lower than the set threshold, in the case that the scintillation pulse is the positive-going scintillation pulse; and the median value point of the P time points is recorded as the time point when, the scintillation pulse passes over the set threshold, during the second phase where the scintillation pulse passes over and is lower than the set threshold, and the median value point of the S time points is recorded as the time point when the scintillation pulse passes over the set threshold during the fourth phase where the scintillation pulse passes over and is higher than the set threshold, in the case that the scintillation pulse is the negative-going scintillation pulse.

8. A device for acquiring a time point when a scintillation pulse passes over a threshold, comprising:

a comparison unit configured to output level signals based on a relationship between the scintillation pulse and a set threshold, wherein high-level signals are outputted yin a case that an amplitude of the scintillation pulse is higher than the set threshold, or low-level signals are outputted in a case that the amplitude of the scintillation pulse is lower than the set threshold, a delay chain composed of several cascaded delay elements and configured to receive and output the high-level signals and the low-level signals;

a scintillation, pulse state time code recording unit comprising an, uniform-frequency square wave signal, a counter, and a data buffer unit, wherein the counter is configured to record the number of rising edges of the square wave, the data buffer unit is configured to record output signals of the delay elements in the delay chain at a time instant when the rising edge of the square wave is arrived, the output signals of the delay chain and the number of rising edges of the square wave are combined into a time code;

a time code sorting unit configured to sort the output signals of the delay chain, according to a characteristic of the recorded output signals of the delay elements in the delay chain at a time instant when the rising edge of the square wave is arrived;

a relative time interpretation unit configured to interpret a time interval between a transition of the scintillation pulse and a subsequent rising edge of the square wave;

a time calculation and transmission unit configured to calculate time points for transitions according to time information acquired by the relative time interpretation unit, acquire an accurate time point when the scintillation pulse passes over the set threshold by selecting one of the time points or weighting any two or more of the time points, and transmit the accurate time point to a next unit.

9. The device for acquiring a time point when a scintillation pulse passes over a threshold according to claim 8, wherein the delay elements in the delay chain is configured to receive a signal transmitted by a previous cascaded delay element, output an inverse signal of which a state is opposite to that of the received signal, and transmit the inverse signal to a next cascaded delay element after a time interval dt.

10. The device for acquiring a time point when a scintillation pulse passes over a threshold according to claim 8, wherein a frequency of the uniform-frequency square wave signal of the scintillation pulse state time code recording unit is in a range from 10 MHz to 20 GHz.

11. The device for acquiring a time point when a scintillation pulse passes over a threshold according to claim 8, wherein the output signals of the delay chain are sorted by the time code sorting unit into five types of sequences respectively having characteristics of: a sequence consisting of consecutive 1, a sequence starting with a plurality of consecutive 0, then switching to 1, subsequently repeatedly switching between 0 and 1, and ending with a plurality of consecutive 1, from a least significant bit, LSB, to a most significant bit, MSB, a sequence consisting of consecutive 0, a sequence starting with a plurality of consecutive 1, then switching to 0, subsequently repeatedly switching between 0 and 1, and ending with a plurality of 0, from the LSB to the MSB, and a sequence consisting of consecutive 1, in a case that the scintillation pulse is a positive-going scintillation pulse; the positive-going scintillation pulse comprises a first phase where the scintillation pulse is lower than the set threshold, a second phase where the scintillation, pulse passes over and is higher than the set threshold, a third phase where the scintillation pulse is higher than the set threshold, a fourth phase where the scintillation pulse passes over and, is lower than the set threshold and fifth a phase where the scintillation pulse is lower than the set threshold, of which the five phases occur sequentially; and the output signals of the delay chain are sorted by the time code sorting unit into five types of sequences respectively having characteristics of a sequence consisting of consecutive 0; a sequence starting with a plurality of 1, then switching to 0, subsequently repeatedly switching between 0 and 1, and ending with a plurality of 0 from the LSB to the MSB, a sequence consisting of consecutive 1, a sequence starting with a plurality of 0, then switching to 1, subsequently repeatedly switching between 0 and 1, and ending with a plurality of 1, from the LSB to the MSB, and a sequence consisting of consecutive 0, in, a case that the scintillation pulse is a negative-going scintillation pulse; the negative-going scintillation pulse which comprises a first phase where the scintillation pulse is higher than the set threshold, a second phase where the scintillation pulse passes over and is lower than the set threshold, a third phase where the scintillation pulse is lower than the set threshold, a fourth phase where the scintillation pulse passes over and is higher than the set threshold and a fifth phase where the scintillation pulse is higher than the set threshold, of which the five phases occur sequentially.

12. The device for acquiring a time point when a scintillation pulse passes over a threshold according to claim 11, wherein the relative time interpretation unit is configured to count the number of delay elements until a first 1 occurs from the LSB to the MSB to indicate a time period required for the first transition from a low level to a high level, and the number of delay elements until a last 0 occurs from the LSB to the MSB to indicate a time period required, for the last transition, from a low level to a high level during the second phase where the scintillation pulse passes over and is higher than the set threshold, and to count the number of delay elements until a last 1 occurs from the LSB to the MSB to indicate a time period required for the first transition from a high level to a low level, and the number of delay elements until a first 0 occurs from the LSB to the MSB to indicate a time period required for the last transition from a high level to a low level during the fourth phase where the scintillation pulse passes over and is lower than the set threshold, in the case that the scintillation pulse is the positive-going scintillation pulse; and the relative time interpretation unit is configured to count the number of delay elements from the LSB to the MSB until a first 0 occurs to indicate a time period required for the first transition from a high level to a low level, and the number of delay elements from the LSB to the MSB until a last 1 occurs to indicate a time period required for the last transition from a high level to a low level during the second phase where the scintillation pulse passes over and is lower than the set threshold; and to count the number of delay elements from the LSB to the MSB until a last 0 occurs to indicate a time period required for the first transition from a low level to a high level, and the number of delay elements from the LSB to the MSB until a first 1 occurs to indicate a time period required for the last transition from a low level to a high level during the fourth phase where the scintillation pulse passes over and is higher than the set threshold, in the case that the scintillation pulse is the negative-going scintillation pulse.

* * * * *

UNITED STATES PATENT AND TRADEMARK OFFICE
CERTIFICATE OF CORRECTION

PATENT NO. : 10,120,342 B2
APPLICATION NO. : 15/035996
DATED : November 6, 2018
INVENTOR(S) : Daoming Xi et al.

Page 1 of 1

It is certified that error appears in the above-identified patent and that said Letters Patent is hereby corrected as shown below:

In the Claims

In Column 18, Line 22, change "threshold," to --threshold--.

In Column 19, Line 7, change "level," to --level--.

In Column 20, Line 38, change "than," to --than--.

In Column 21, Line 24, change "when," to --when--.

In Column 21, Line 39, change "yin" to --in--.

In Column 21, Line 42, change "threshold," to --threshold;--.

In Column 21, Line 46, change "scintillation," to --scintillation--.

In Column 21, Line 47, change "an," to --an--.

In Column 22, Line 34, change "scintillation," to --scintillation--.

In Column 22, Line 37, change "and," to --and--.

In Column 22, Line 52, change "in," to --in--.

In Column 23, Line 3, change "required," to --required--.

In Column 23, Line 4, change "transition," to --transition--.

In Column 23, Line 6, change "threshold," to --threshold;--.

Signed and Sealed this
Seventh Day of May, 2019

Andrei Iancu
*Director of the United States Patent and Trademark Office*